United States Patent [19]

Hood et al.

[11] Patent Number: 5,099,394
[45] Date of Patent: Mar. 24, 1992

[54] OFFSET BASECARD

[75] Inventors: Robert A. Hood, Boca Raton; John W. Reiswig, Boynton Beach, both of Fla.

[73] Assignee: International Business Machines Corporation, Armonk, N.Y.

[21] Appl. No.: 426,611

[22] Filed: Oct. 24, 1989

[51] Int. Cl.⁵ ............................................. H01R 23/68
[52] U.S. Cl. .................................. 361/413; 361/412; 439/74
[58] Field of Search ............ 361/395, 412, 399, 413, 361/415; 439/59, 61, 62, 74, 64, 633

[56] References Cited

U.S. PATENT DOCUMENTS

| | | | |
|---|---|---|---|
| 3,300,686 | 1/1967 | Johnson et al. | 317/101 |
| 4,511,950 | 4/1985 | Bunner et al. | 361/413 |
| 4,683,550 | 7/1987 | Jindrick et al. | 364/900 |
| 4,834,660 | 5/1989 | Cotti | 439/67 |
| 4,840,570 | 6/1989 | Mann, Jr. et al. | 361/413 |
| 4,899,254 | 2/1990 | Ferchan et al. | 361/415 |
| 4,924,355 | 5/1990 | Mitchell et al. | 361/415 |

FOREIGN PATENT DOCUMENTS 2163305  2/1986  United Kingdom ............... 439/62

Primary Examiner—Gregory D. Thompson
Attorney, Agent, or Firm—John C. Smith

[57] ABSTRACT

In an adapter card having an attached daughter card, the adapter card is offset from its edge connector, such that the edge connector occupies one plane and the basecard occupies a parallel plane, thereby allowing the daughter card to attach to the basecard and occupy the same plane as the edge connector which allows the daughter card to use an I/O connector without violating the space envelope of the next basecard, and also allows a daughter card to be interchanged between systems with different packaging architectures.

4 Claims, 3 Drawing Sheets

OFFSET BASECARD

TECHNICAL FIELD

This invention relates to printed circuit adapter cards for computers. In particular, this invention relates to printed circuit adapter cards which can attach to daughter cards designed for systems with a different architecture, and which can attach daughter cards with integral I/O connecters without violating the space envelope of the next printed circuit adapter card.

BACKGROUND ART

In a typical micro-computer, printed circuit boards are used to hold the bulk of the electronic circuitry. A common design is to use a large printed circuit board to hold the circuitry required to operate the basic functions of the computer. This large printed circuit board will be referred to herein as a mother board.

In addition the basic functions of the computer, which are performed by the circuitry on the mother board, a number of other functions have been developed to perform specific tasks for a computer user. For example, large data storage requirements have been satisfied through the use of storage devices such as magnetic disk devices and optical disc storage devices, and a variety of printing devices have been developed to support the requirement for printed output. The wide variety of input/output (I/O) devices available each have specific electronic circuitry requirements to allow the computer to control the operation of, and interface with, the I/O device. Since the particular work a computer is used for will dictate the types of required I/O devices, it is economically inefficient to include circuitry as a standard feature on the mother board which supports a specific type of I/O device or a specific optional function.

Recognition of this inefficiency led to the development of printed circuit base adapter cards (hereinafter referred to as basecards). Basecards are printed circuit boards which are designed to hold electronic circuitry required to perform a specific function, such as controlling a printer or storage device and interfacing that device with the mother board, or any other desired function. The specific function performed is not important for the purposes of this disclosure. The advantage of using basecards is that it requires the cost of circuitry to be incurred only when it is required to support a specific function. Basecards typically have edge connectors with electrical contacts which can be plugged into a connector on the mother board, thereby adding the basecard circuitry to the circuitry on the mother board. In addition, basecards which connect to I/O devices usually have an I/O connector on an edge of the card which allows a cable to be connected between the I/O device and the basecard. In a typical microcomputer, the mother board has multiple connectors to attach to multiple basecards. While the plane of the basecard is often perpendicular to the plane of the mother board, it is not required to be perpendicular, and may in fact be oriented at any angle convenient for packaging purposes.

Over time, the types of functions performed by basecards have become increasingly complex, with a corresponding increase in circuit requirements. This has led, in turn, to the development of daughter cards. A daughter card is defined for the purposes of this disclosure as a printed circuit card which connects to a basecard and adds circuitry to the basecard in the same manner as the basecard adds circuitry to the mother board. It is typically attached to the basecard in a plane which is substantially parallel to the plane of the basecard. Likewise, more than one type of daughter card may be designed for a basecard, just as more than one type of basecard may be designed for a mother board.

The use of multiple basecards by a mother board has imposed space constrains. The space constraints result in a defined physical space envelope in which each basecard may be placed. As a consequence, and an additional limitation on the location of the I/O connector is created which requires that the connector be attached to the basecard. This is due to the thickness of the I/O connector which, if placed on the daughter card, would impinge on the space envelope of the next basecard. The limitation on the location of the I/O connector requires the use of a connector which can be used by any of the daughter cards which might be connected to the basecard. It is possible that each of the multiple optional daughter cards available for a given basecard may have a different I/O connector requirement due to the number of connection lines required for the particular I/O device. This generally results in the selection of the I/O connector with the largest number of lines, and hence, the I/O connector with the highest cost.

In addition to the added cost of daughter cards caused by the lack of flexibility in choice of connectors, another problem exists due to the normal evolution of system architecture which is even more costly. As each new generation of computers is developed to replace the previous generation, changes in physical packaging can prevent daughter cards from being used in the new generation of computers. Likewise, daughter cards developed for the new generation of computers may not fit in older generation computers. This incompatibility causes several problems.

Purchasers of computers with daughter cards have a significant investment in the cards. That investment may effect the ability of the purchaser to change to a new system if the cost of replacing the function provided by the daughter cards makes the change economically prohibitive. Likewise, a daughter card developed for another system architecture may be very desirable to a purchaser, but be economically prohibitive to use if the entire system must be changed due to incompatibility of the card with the purchaser's system.

For similar reasons, incompatibility of daughter cards developed for systems of different architecture types causes problems for manufacturers as well as purchasers. A significant investment in daughter cards of one architecture type will discourage purchasers from investing in a different architecture type. In addition, manufacture of multiple daughter cards having the same function, but packaged for multiple architecture types, will increase manufacturing costs, increase inventory stocking problems, and increase the ultimate cost to the purchaser.

Thus, incompatibility caused by differences in packaging between different architecture types impairs the ability of computer purchasers to upgrade to new computers or to use functions developed for other architecture types. In addition, it also increases the cost of manufacturing daughter cards, inventory costs, and purchase costs.

SUMMARY OF THE INVENTION

An object of this invention is to use an I/O connector designed for a specific daughter card.

Another object of this invention is to use I/O connectors on daughter cards without violating the physical space envelope of the basecard.

It is yet another object of this invention to use daughter cards developed for one architecture type on a system based on a different architecture type.

The foregoing and other objects, features and advantages of the invention are achieved by offsetting the basecard from its edge connector, such that the edge connector occupies one plane and the basecard occupies a parallel plane.

DESCRIPTION OF THE PREFERRED EMBODIMENT

By way of general overview, the problems discussed above, relating to incompatibility of cards between differing architecture types and space envelope problems Caused by placing I/O connectors on daughter cards, is overcome by modifying the basecard on one of the system types such that a daughter card can fit within the space envelope of the basecard. This is accomplished by offsetting the basecard from its edge connector. By offsetting the basecard, a daughter card designed for another architecture can fit in the packaging structure of the present system, thereby allowing migration of daughter cards between different packaging architecture types. In addition, the daughter card can have an integral I/O connector without violating the space envelope of the basecard of either architecture type, thereby eliminating the need for a more expensive I/O connector on the basecard.

Figure 1:
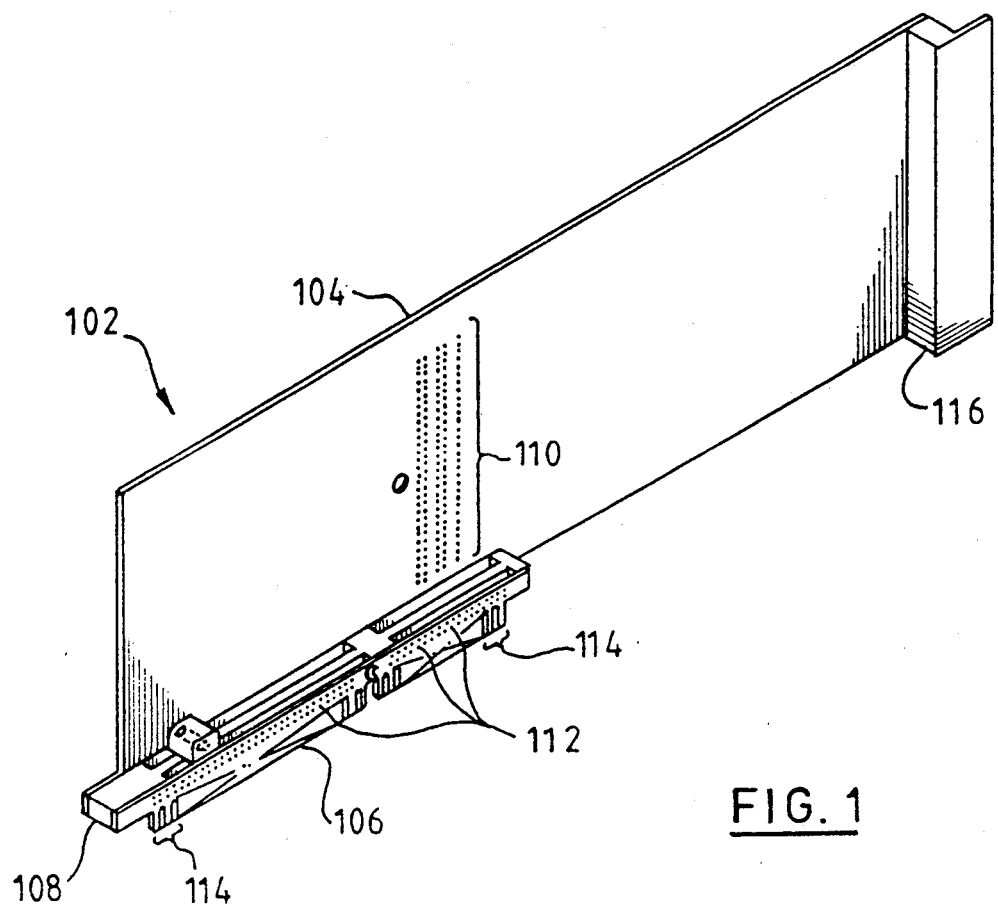
FIG. 1 is shows a perspective view of the basecard with offset edge connector.

FIG. 1 shows an embodiment of the basecard 102. The printed circuit 104 is shown as a blank card for ease of illustration. The specific circuitry used on the basecard 102 is not shown because it will vary depending on the type of I/O device or function and is not necessary to understanding the invention. Electrical connections 110 are shown to illustrate the location where the daughter card (shown in FIGS. 3-5) would attach electrically to the basecard 102 in the preferred embodiment. Those skilled in the art will realize that the location of the electrical connections 110 is an arbitrary design choice. In practice, a male or female connector can be attached to the printed circuit 104 via electrical connections 110 for mating with a female or male connector, respectively, on the daughter card (not shown). In addition, it is also possible to permanently attach the daughter card to the basecard 102 via permanent electrical wire connection. However, detachable electrical connectors would be used in the preferred embodiment to facilitate ease of removal or substitution of the daughter card. The specific mating connectors used are a mere design choice based on the requirements of the particular circuit used by the printed circuit 104 and can be chosen from numerous commercially available connectors.

As FIG. 1 shows, the edge connector 106 is separated from the printed circuit 104 by an offset 108. The edge connector 106 is shown to be in a substantially parallel plane with the printed circuit 104 in the preferred embodiment. However, those skilled in the art will understand that the invention can be implemented with the plane of the printed circuit 104 at an angle to the plane of the edge connector 106. The specific offset distance provided by the offset 108 will be a design choice based on several factors, such as space envelope limitations, circuit component types, etc. In prior art adapter boards, well known in the art, the printed circuit 104 and the edge connector 106 would typically be a single element sharing the same plane. The preferred embodiment shown in FIG. 1 offsets the printed circuit 104 to allow use of the plane space above the edge connector 106 by a daughter card.

The conductive pads 114 provide for electrical connection to the mother board (not shown) when inserted into a connector on the mother board. Lines 112 provide electrical connection between the edge connector and printed circuit 104. Lines 112 run through offset 108. Lines 112 connect to conductive pads 114 to provide signal paths between the mother board and printed circuit 104. The edge connector 106 is shown in two sections for illustrative purposes. However, mere design choices based on the particular mother board and basecard in question will determine the actual configuration in practice.

FIG. 1 also shows support tab 116. Support tab 116 is inserted in supports commonly found in micro-computers to hold the end of a basecard in place. This type of physical support method is well known in the art. As shown, the support tab 116 is offset the same distance as the edge connector 106. This allows the support tab 116 to be in the same plane as the edge connector 106, which in turn allows the basecard 102 to be inserted in the micro-computer without relocating the supports. It will be understood by those skilled in the art that the support tab is an optional feature because the basecard 102 for a particular function can be a short card which does not extend to the end of its card slot.

Figure 2:
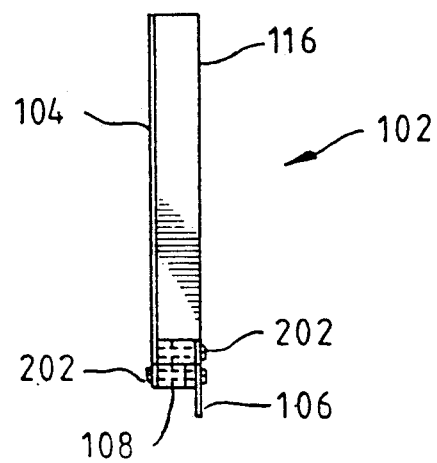
FIG. 2 shows an edge view of the basecard looking into the plane of the card.

FIG. 2 shows an end view of the basecard described above in the discussion of FIG. 1. In addition, mounting screws 202, which provide the physical connection of the edge connector 106, the printed circuit 104 and the offset 108 are shown. Those skilled in the art will recognize that many other attachment techniques are well known in the art. Support tab 116 is shown aligned in the same plane as the edge connector 106.

Figure 3:
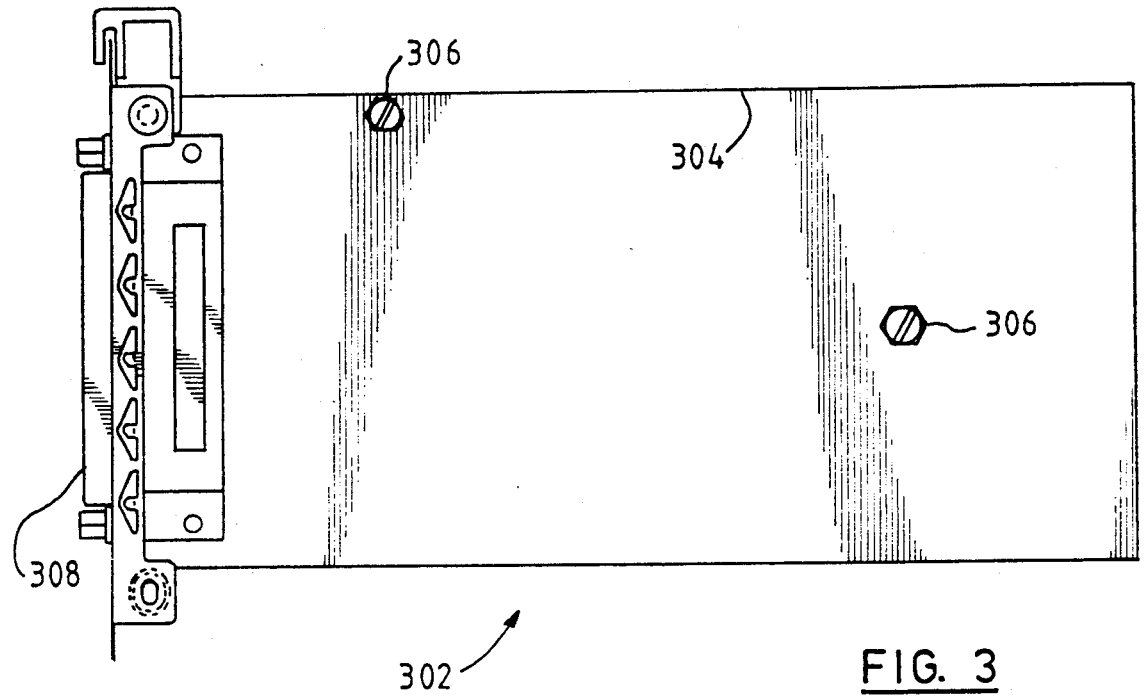
FIG. 3 is a side view of a daughter card.

FIG. 3 shows a side view of a daughter card 302. The circuit components will vary for the same reasons that the circuit components on the printed circuit 104, discussed above, will vary and are, therefore, not shown. Daughter card 302 shows daughter circuit 304 which would, in practice, have the circuitry for the daughter card function mounted thereon. Mounting screws 306 show a typical method of physically attaching the daughter card 302 to the basecard 102. It is understood that the actual method of physical attachment and the location of the attaching points are a mere design choice. At the left end of daughter card 302 is I/O connector 308. The particular I/O connector used will also vary based on the function of the daughter card 302.

Figure 4:
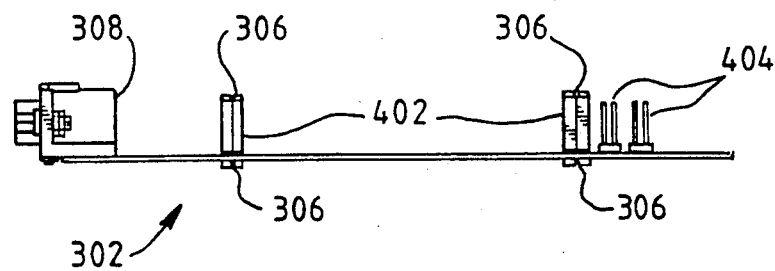
FIG. 4 is an edge view of a daughter card.

FIG. 4 shows a top view of the daughter card 302. Mounting screws 306 are shown contained in spacers 402. I/O connector 308 is shown at the left end of daughter card 302. Electrical connections 404 are shown to illustrate one type of electrical connection for providing signal connection between the daughter card 302 and the basecard 102.

Figure 5:
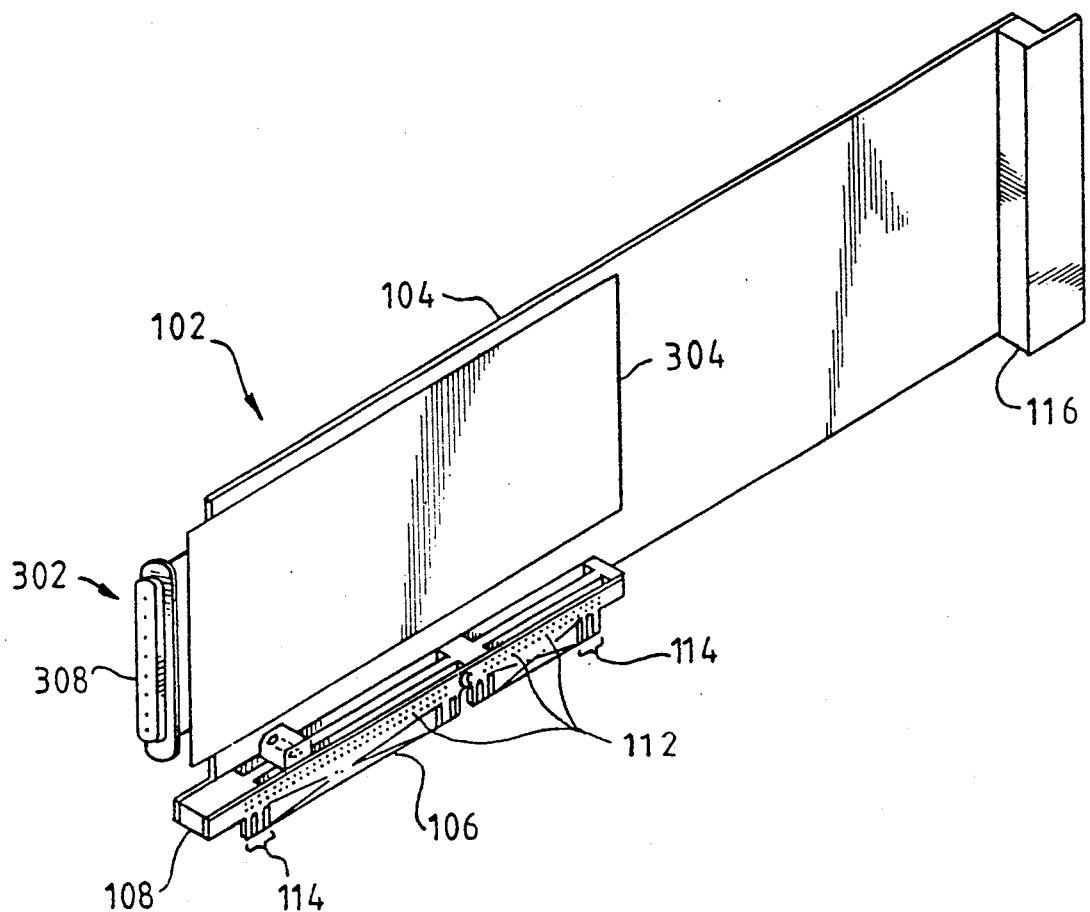
FIG. 5 is a perspective view of the basecard with and attached daughter card.

FIG. 5 shows the position a daughter card 302 would occupy in relation to a printed circuit 104, and an edge connector 106 on a basecard 102. As shown in the preferred embodiment, the daughter card 302 is generally within the plane occupied by the edge connector 106 and in a plane parallel to that occupied by the printed circuit 104.

As a result of offsetting the basecard 102, an I/O adapter 308 specifically designed to meet the requirements of the daughter card 302 can be directly attached to the daughter card 302 without violating the envelope space of the basecard 102 of either architecture type. As a result, the requirement for a general purpose I/O connector 308 on the basecard 102 is eliminated, allowing the least cost I/O connector 308 to be selected for the basecard 102/daughter card 302 combination.

In addition, the offset basecard 102 allows more flexibility in physically locating a daughter card 302 in a space envelope. This allows daughter cards 302, which would not normally fit in a given packaging architecture to be used without modification. As a result, daughter cards can be migrated from one architecture type to another.

While the invention has been particularly shown and described with reference to preferred embodiments, it will be understood by those skilled in the art that various changes in detail may be made therein without departing from the spirit, scope, and teaching of the invention. For example, the plane used by the daughter card can vary from the plane used by the edge connector without violating the space envelope. Likewise, it is not critical that the basecard plane and daughter card plane be parallel. Accordingly, the invention herein disclosed is to be limited only as specified in the following claims.

We claim:

1. A base circuit card assembly for mounting on a mother board, comprising:
    a daughter card;
    a base circuit card, the base circuit card further comprising:
        an edge connector for electrical attachment of the base circuit card to a mother board,
        an offset attached between the base circuit card and the edge connector for positioning the base circuit card such that the base circuit card is offset to one side of the edge connector, and
        means for electrically attaching the daughter circuit card to the base circuit card such that the daughter card is aligned in substantially the same plane as the edge connector;
    whereby, the daughter circuit card can attach to the base circuit card without violating the space envelope of the base circuit card and the plane of the daughter card relative to the plane of the edge connector is determined by the thickness of the offset.

2. A base circuit card assembly, as in claim 1, wherein the daughter card further comprises at least one I/O connector for electrically attaching the daughter card to an I/O device.

3. A method for attaching a daughter card to a base circuit card without violating the space envelope of the base circuit card, comprising:
    separating an edge connector from the base circuit card;
    attaching an offset connector between the edge connector and the base circuit card; and
    attaching a daughter card to the base circuit card such that the daughter card occupies a plane substantially parallel to the base circuit card, and the daughter card is aligned in substantially the same plane as the edge connector which is determined by the thickness of the offset connector.

4. A method, as in claim 3, comprising the further step of attaching an I/O connector to an edge of the daughter card, the I/O connector attached such that it is contained within the space envelope of the base circuit card.

* * * * *